US010128839B2

United States Patent
Ohashi et al.

(10) Patent No.: US 10,128,839 B2
(45) Date of Patent: Nov. 13, 2018

(54) MULTIDIRECTIONAL INPUT DEVICE INCLUDING A POSITION DETECTOR THAT DETECTS A NEUTRAL POSITION AND A MOVING DIRECTION OF THE MOVABLE BODY

(71) Applicant: Panasonic Intellectual Property Management Co., Ltd., Osaka (JP)

(72) Inventors: Yosuke Ohashi, Fukui (JP); Tatsuya Miyazaki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/500,372

(22) PCT Filed: Sep. 2, 2015

(86) PCT No.: PCT/JP2015/004453
§ 371 (c)(1),
(2) Date: Jan. 30, 2017

(87) PCT Pub. No.: WO2016/035332
PCT Pub. Date: Mar. 10, 2016

(65) Prior Publication Data
US 2017/0213671 A1 Jul. 27, 2017

(30) Foreign Application Priority Data

Sep. 4, 2014 (JP) .................................. 2014-179876
Oct. 14, 2014 (JP) .................................. 2014-209577

(51) Int. Cl.
*H03K 17/96* (2006.01)
*H03K 17/968* (2006.01)
(Continued)

(52) U.S. Cl.
CPC ............ *H03K 17/9631* (2013.01); *G05G 1/02* (2013.01); *H01H 25/002* (2013.01); *H03H 9/175* (2013.01); *H03K 17/968* (2013.01)

(58) Field of Classification Search
None
See application file for complete search history.

(56) References Cited

U.S. PATENT DOCUMENTS

| 7,310,084 | B2 * | 12/2007 | Shitanaka | ............... | H01H 25/04 |
| | | | | | 200/5 A |
| 2002/0058549 | A1 * | 5/2002 | Armstrong | ............... | A63F 13/06 |
| | | | | | 463/37 |

(Continued)

FOREIGN PATENT DOCUMENTS

| JP | 2002-260494 | 9/2002 |
| JP | 2008-146968 | 6/2008 |
| JP | 2009-266734 | 11/2009 |

OTHER PUBLICATIONS

International Search Report of PCT application No. PCT/JP2015/004453 dated Nov. 24, 2015.

*Primary Examiner* — David D Davis
(74) *Attorney, Agent, or Firm* — Greenblum & Bernstein, P.L.C.

(57) ABSTRACT

A multidirectional input device of the present disclosure includes a case, a movable body that is mounted on the case so as to be movable in a plurality of directions with a predetermined neutral position as a base point, a first position detector that outputs a first signal in response to a position of the movable body, a second position detector that outputs a second signal when the movable body is located at the neutral position, and a controller that detects a moving direction of the movable body by the first signal. The (Continued)

controller corrects a threshold value for determination for detecting the moving direction in response to the first signal and the second signal.

2 Claims, 5 Drawing Sheets

(51) Int. Cl.
*H03H 9/17* (2006.01)
*H01H 25/00* (2006.01)
*G05G 1/02* (2006.01)

(56) References Cited

U.S. PATENT DOCUMENTS

| | | | |
|---|---|---|---|
| 2004/0035237 A1* | 2/2004 | Matsui | F16H 59/105 74/473.12 |
| 2011/0032185 A1* | 2/2011 | Yamamoto | G06F 3/0346 345/157 |
| 2011/0043447 A1* | 2/2011 | Inaba | G06F 3/0354 345/157 |
| 2014/0239163 A1* | 8/2014 | Miyazaki | G01J 1/0271 250/221 |

* cited by examiner

MULTIDIRECTIONAL INPUT DEVICE INCLUDING A POSITION DETECTOR THAT DETECTS A NEUTRAL POSITION AND A MOVING DIRECTION OF THE MOVABLE BODY

This application is a U.S. national stage application of the PCT International Application No. PCT/JP2015/004453 filed on Sep. 2, 2015, which claims the benefit of foreign priority of Japanese patent application 2014-179876 filed on Sep. 4, 2014 and Japanese patent application 2014-209577 filed on Oct. 14, 2014 the contents all of which are incorporated herein by reference.

TECHNICAL FIELD

The present disclosure relates to a multidirectional input device used for operation of an electronic device. The present technology mainly relates to a multidirectional input device used for operation of various electronic devices in a motor vehicle.

BACKGROUND ART

In recent years, multidirectional input devices enabling various operation such as rotary operation, pressing operation, and moving operation are provided in instrument panels, combination switches, or the like in vehicle interior. Multidirectional input devices enabling operation of various electronic devices such as a car navigation device, an audio device, and an air conditioner in vehicle interior are increasing. Furthermore, multidirectional input devices enabling operation of headlights, windshield wipers, or direction indicators of vehicles are increasing. A multidirectional input device having various functions and enabling more reliable operation is required.

As conventional multidirectional input devices, for example, PTL 1 and PTL 2 are known.

CITATION LIST

Patent Literature

PTL 1: Unexamined Japanese Patent Publication No. 2008-146968

PTL 2: Unexamined Japanese Patent Publication No. 2009-266734

SUMMARY OF THE INVENTION

A multidirectional input device of the present disclosure includes a case, a movable body that is mounted on the case so as to be movable in a plurality of directions with a predetermined neutral position as a base point, a first position detector that outputs a first signal in response to a position of the movable body, a second position detector that outputs a second signal when the movable body is located at the neutral position, and a controller that detects a moving direction of the movable body by the first signal. The controller corrects a threshold value for determination for detecting the moving direction in response to the first signal and the second signal.

DESCRIPTION OF EMBODIMENT

Prior to description of an exemplary embodiment, a problem of conventional multidirectional input devices noticed by inventor(s) is described.

In the conventional multidirectional input devices, in a case where ambient temperature change, voltage variation of a power supply or the like is caused during use, a voltage signal output from a light receiving/emitting element varies in response to reflected light from a reflection part. For example, it is assumed that a voltage signal of 3 V is set to be output in a state where the multidirectional input device is located at a neutral position. However, in a case where ambient temperature change or voltage variation of a power supply is caused during use, a voltage signal of 1.5 V is output although an operation body and a movable body are each located at a neutral position. In this case, although the operation body and the movable body are each located at the neutral position, for example, a controller erroneously detects that the operation body is operated to move in a right direction.

As described above, the conventional multidirectional input devices have a problem that a voltage value of an output signal varies depending on a surrounding environment or the like, the controller performs erroneous detection, and malfunction is caused.

Hereinafter, an exemplary embodiment of the present invention is described with reference to FIG. 1A to FIG. 5B.

EXEMPLARY EMBODIMENT

Figure 1A:
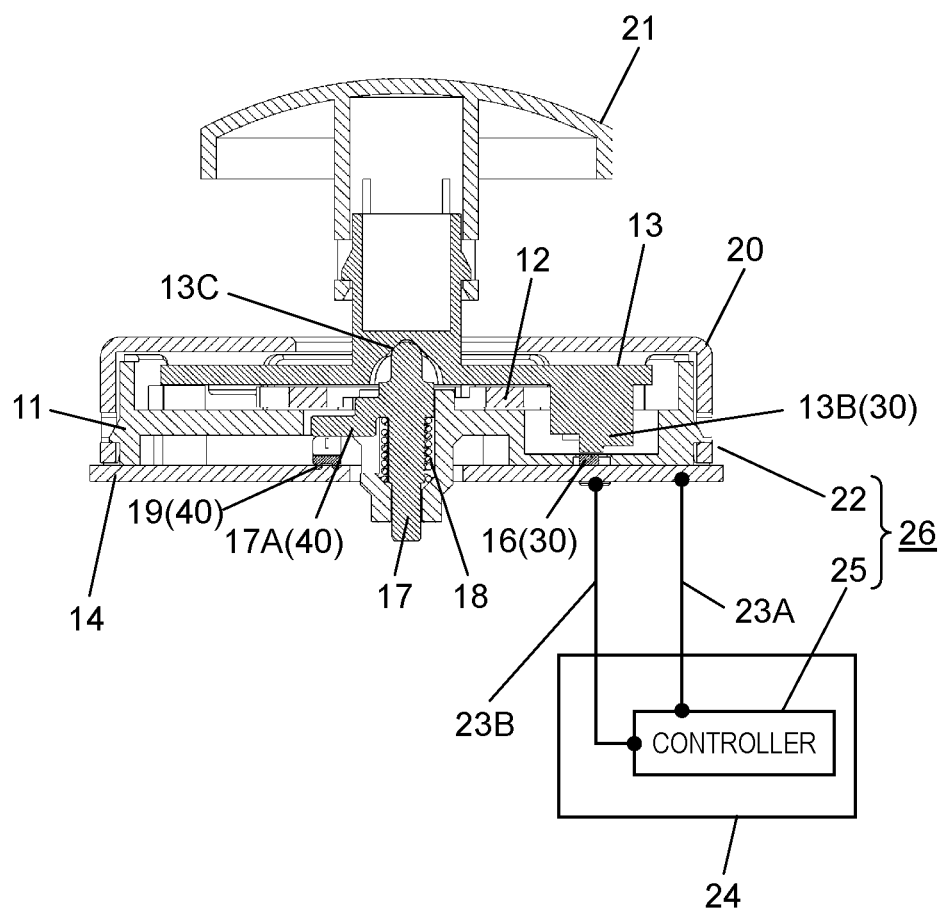
FIG. 1A is a sectional view of a multidirectional input device according to an exemplary embodiment.
Figure 2:
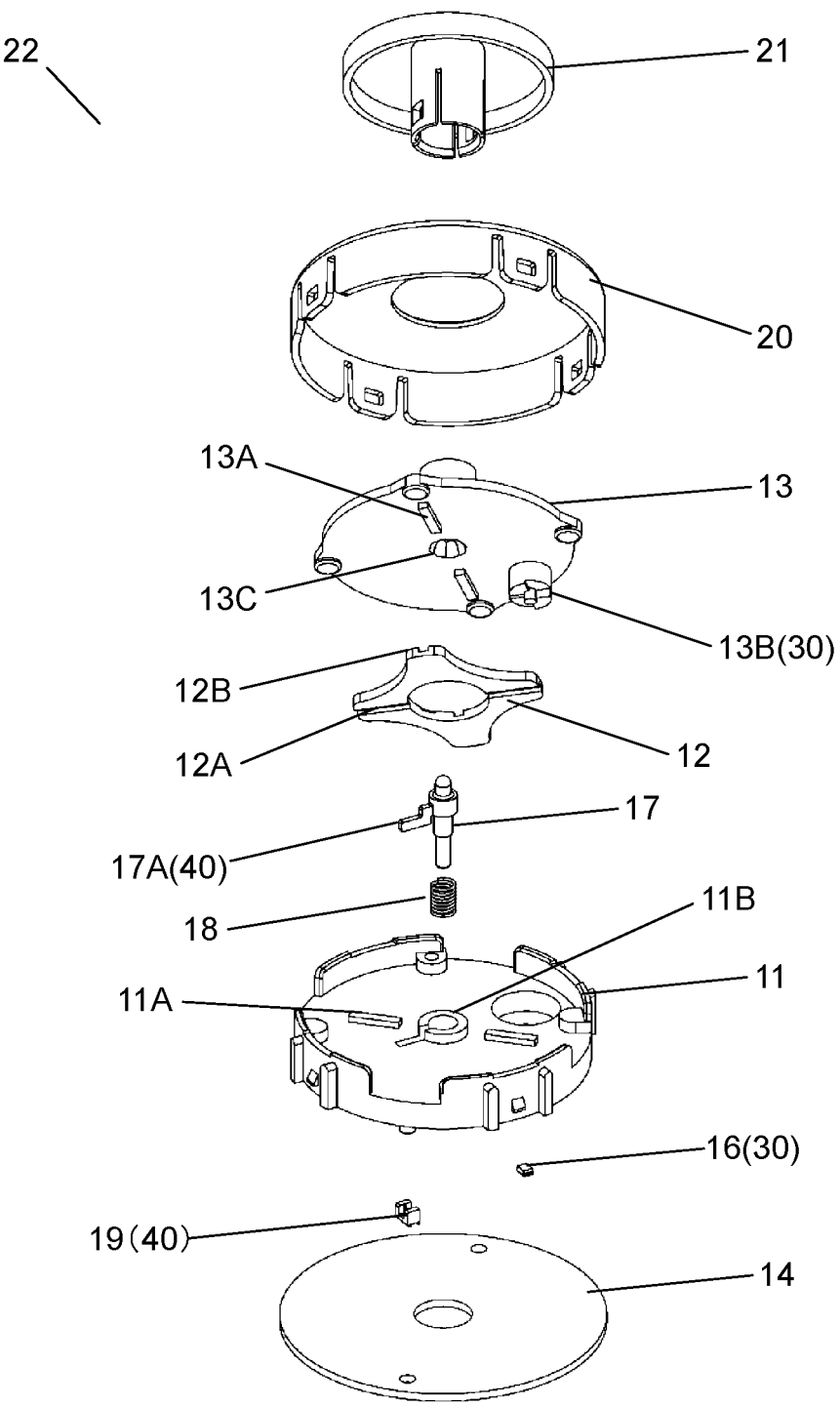
FIG. 2 is an exploded perspective view of a multidirectional input unit in the multidirectional input device according to the exemplary embodiment.
Figure 3:
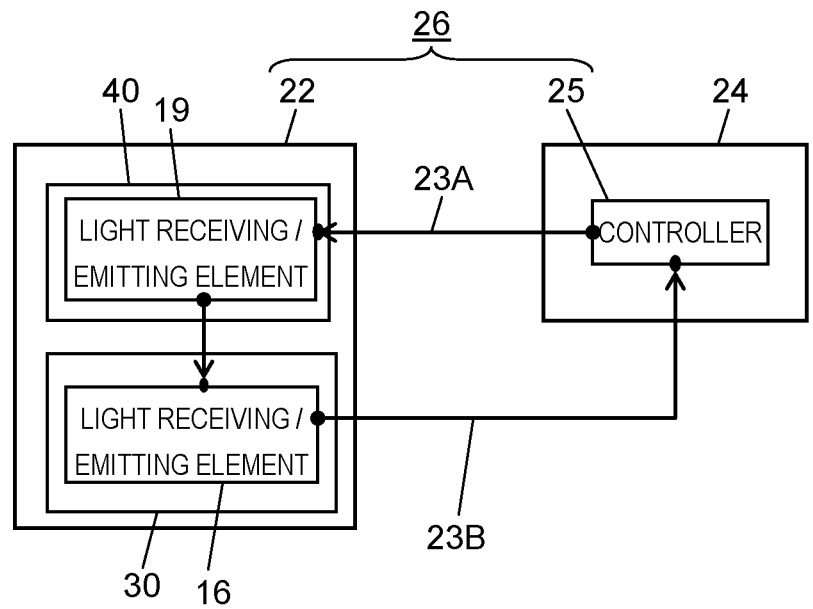
FIG. 3 is a block diagram of the multidirectional input device according to the exemplary embodiment.
Figure 4:
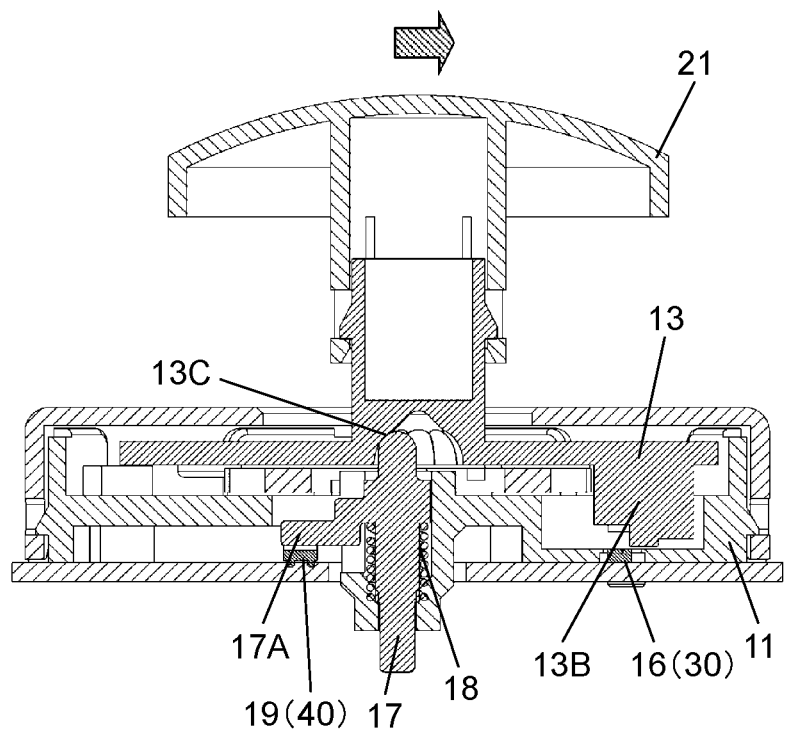
FIG. 4 is a sectional view in operation of the multidirectional input unit in the multidirectional input device according to the exemplary embodiment.
Figure 5A:
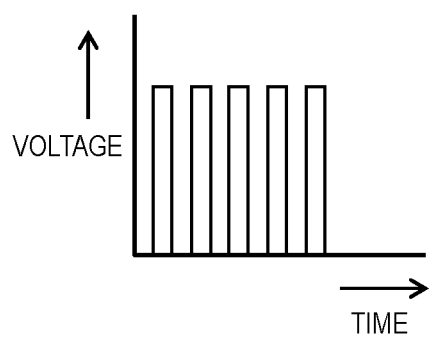
FIG. 5A is a signal waveform diagram of the multidirectional input device according to the exemplary embodiment.
Figure 5B:
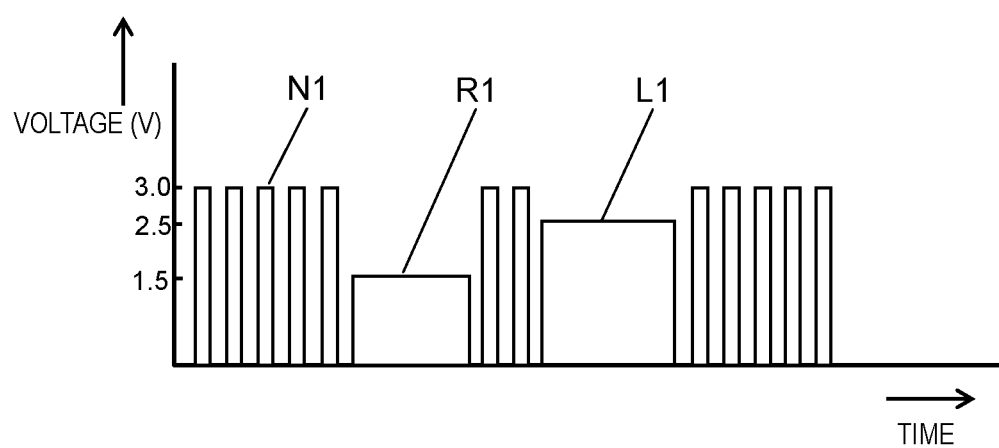
FIG. 5B is a signal waveform diagram of the multidirectional input device according to the exemplary embodiment.

FIG. 1A is a sectional view of multidirectional input device 26 according to this exemplary embodiment. FIG. 2 is an exploded perspective view of multidirectional input unit 22 in multidirectional input device 26 of this exemplary embodiment. FIG. 3 is a block diagram of multidirectional input device 26 according to this exemplary embodiment. FIG. 4 is a sectional view in operation of multidirectional input unit 22 according to this exemplary embodiment. FIG. 4 illustrates a state where operation body 21 is operated to move in a right direction of the drawing. FIG. 5A and FIG. 5B each are a signal waveform diagram of multidirectional input device 26 according to this exemplary embodiment.

[Configuration of Multidirectional Input Device]

First, a configuration of multidirectional input device 26 of the exemplary embodiment is described.

As illustrated in FIG. 1A, case 11 is made of insulation resin, and is formed in a substantially disk shape. Slider 12 is made of insulation resin. Wall parts 11A formed on an upper surface of case 11 are inserted into grooves 12A provided in a right-left direction on a lower surface of slider 12 made of resin. Slider 12 is mounted on the upper surface of case 11 so as to be movable in the right-left direction.

Further, movable body 13 is made of insulation resin, and wall parts 13A are provided in a front-rear direction on a lower surface of movable body 13. Wall parts 13A are inserted into grooves 12B formed on an upper surface of slider 12, and movable body 13 is mounted on the upper surface of slider 12 so as to be movable in the front-rear direction.

As illustrated in FIG. 1A and FIG. 2, slider 12 is mounted on the upper surface of case 11 so as to be slidable in the right-left direction. Furthermore, movable body 13 is mounted on the upper surface of slider 12 so as to be slidable in the front-rear direction orthogonal to the right-left direction. Accordingly, movable body 13 is mounted so as to be movable in the right-left direction, in the front-rear direction, and in a plurality of directions between the right-left direction and the front-rear direction, in a state where movable body 13 is restrained from rotating relative to case 11 via slider 12. That is, movable body 13 is mounted on case 11 via slider 12 so as to be movable in any direction.

On upper and lower surfaces of wiring board 14, a plurality of wiring patterns (not illustrated) are formed. Light receiving/emitting element 16 is provided on the upper surface of wiring board 14. Light receiving/emitting element 16 is formed from a light emitting diode, a phototransistor, or the like. On the lower surface of movable body 13, reflection part 13B formed from a plurality of substantially stepped planar parts is provided. Light receiving/emitting element 16 is disposed so as to face reflection part 13B at a predetermined gap. Combination of light receiving/emitting element 16 and reflection part 13B is represented by position detector 30.

Furthermore, restraint member 17 is made of insulation resin, and is formed in a pin shape. Spring 18 is spirally wound. Spring 18 is housed in guide part 11B located at a central part of case 11 in a slightly warped state. A restraint part is formed such that an upper end of restraint member 17 urged by spring 18 is in elastic contact with a central part of cam part 13C on the lower surface of movable body 13, and movable body 13 is urged to a neutral position.

Next, another position detector (neutral position detector 40) different from position detector 30 configured of light receiving/emitting element 16 and reflection part 13B is described. Neutral position detector 40 configured of light receiving/emitting element 19 and arm part 17A is a position detector provided in order to detect a neutral position. In restraint member 17, arm part 17A is provided. Arm part 17A extends laterally from restraint member 17.

On the upper surface of wiring board 14, light receiving/emitting element 19 is provided. Light receiving/emitting element 19 is disposed so as to face arm part 17A. Light receiving/emitting element 19 is formed by, for example, a photo-interrupter including a light emitting diode, a phototransistor, or the like. As described above, neutral position detector 40 is configured of light receiving/emitting element 19 and arm part 17A.

Cover 20 and operation body 21 are each made of insulation resin. Cover 20 is fixed to the upper surface of case 11 to cover slider 12, movable body 13, and the like. Further, operation body 21 is fixed to an upper end of a cylindrical shaft of movable body 13, protruding from an opening hole in an upper surface of cover 20. As described above, multidirectional input unit 22 is configured.

On multidirectional input unit 22, controller 25 is externally mounted. Multidirectional input unit 22 and controller 25 form multidirectional input device 26. Details of controller 25 are described below.

Multidirectional input unit 22 is mounted on, for example, a console box provided on a lateral side of a driver's seat in a motor vehicle, while operation body 21 protrudes upward. Further, light receiving/emitting element 16 of position detector 30, and light receiving/emitting element 19 of neutral position detector 40 are electrically connected to controller 25 of a microcomputer and the like in control unit 24 such as an audio device of a motor vehicle, via a connector (not illustrated), or lead wires 23A, 23B.

As illustrated in the block diagram of FIG. 3, an output terminal of controller 25 is connected to an input terminal of light receiving/emitting element 19 of neutral position detector 40 via lead wire 23A. Predetermined periodic signals (refer to FIG. 5A) are output from controller 25 to light receiving/emitting element 19 of neutral position detector 40. Furthermore, an output terminal of light receiving/emitting element 19 of neutral position detector 40 is connected to an input terminal of light receiving/emitting element 16 of position detector 30, and an output terminal of light receiving/emitting element 16 is connected to an input terminal of controller 25 via lead wire 23B.

The predetermined periodic signals output from controller 25 to light receiving/emitting element 19 are pulse-like signals as illustrated in the signal waveform diagram of FIG. 5A. These signals are, for example, pulse-like signals of 50 Hz to 500 Hz at a voltage of 5 V.

As described above, multidirectional input device 26 is configured of multidirectional input unit 22 and controller 25.

[Normal Operation of Multidirectional Input Unit 22]
(Operation at Neutral Position)

Next, operation of multidirectional input unit 22 in a state where operation body 21 is not operated, the upper end of restraint member 17 is in elastic contact with the central part of cam part 13C, and movable body 13 is located at a neutral position is described.

As illustrated in FIG. 1A, at a time of engine start or driving a vehicle, operation body 21 is not operated. That is, movable body 13 is located at the neutral position. When movable body 13 is located at the neutral position, arm part 17A extending on a lateral side of restraint member is located above light receiving/emitting element 19 disposed so as to face arm part 17A. Accordingly, arm part 17A which becomes a shield is not interposed between the light emitting part and the light receiving part of light receiving/emitting element 19. Therefore, at this time, light is incident upon the light receiving part from the light emitting part. A voltage signal of a predetermined cycle is output to light receiving/emitting element 16 from light receiving/emitting element 19.

On the other hand, in reflection part 13B disposed on the lower surface of movable body 13, for example, a planar part at a lowermost end in the central part is disposed so as to face light receiving/emitting element 16, as illustrated in FIG. 1A. That is, in the planar part at the lowermost end in the central part among the plurality of planar parts of reflection part 13B, a gap between reflection part 13B and light receiving/emitting element 16 is the narrowest.

Then, a voltage is applied to light receiving/emitting element 16 from controller 25, light receiving/emitting element 16 emits light, this light is reflected on the planar part at the lowermost end of reflection part 13B, and light receiving/emitting element 16 receives reflected light. At this time, the gap between reflection part 13B and light receiving/emitting element 16 is the narrowest, and therefore the reflected light becomes strong light. A voltage (for example, 3 V in a case of a normal ambient temperature and a normal voltage state) in response to this strong reflected light is superimposed with a predetermined periodic signal input from light receiving/emitting element 19 of neutral position detector 40, and neutral position signal N1 illustrated in FIG. 5B is output from light receiving/emitting element 16 to controller 25.

Then, controller 25 detects that neutral position signal N1 is a signal of a predetermined cycle, and determines that movable body 13 is located at the neutral position. At the same time, controller 25 stores a fact that a voltage value when movable body 13 is located at the neutral position (neutral position voltage signal N1) is 3 V.

(Moving Operation in Right Direction)

Now, operation of multidirectional input unit 22 when operation body 21 is operated to move in the right direction is described with reference to FIG. 4.

Operation body 21 is operated to move in a predetermined direction by a hand or the like in a state where a plurality of menus and the like are displayed on a liquid crystal display panel (not illustrated) of a car navigation or the like in front of the driver's seat. For example, as illustrated in FIG. 4, when operation body 21 is operated to move in the right direction, movable body 13 moves the upper surface of case 11 in the right direction since operation body 21 is fixed to the upper end of the cylindrical shaft of movable body 13.

At this time, movable body 13 is moved in the right direction, so that a state is changed such that the upper end of restraint member 17 comes into elastic contact with a left side from the central part of cam part 13C. Restraint member 17 moves downward, and arm part 17A moves into a space between the light emitting part and the light receiving part of light receiving/emitting element 19. At this time, arm part 17A blocks light to be incident upon the light receiving part from the light emitting part. Accordingly, the light from light emitting part is not incident upon the light receiving part. In a state where the light from light emitting part is not incident upon the light receiving part, a neutral position signal of a predetermined cycle is not output from light receiving/emitting element 19.

With the movement of movable body 13 in the right direction, reflection part 13B also moves in the right direction. At this time, in light receiving/emitting element 16, a planar part of reflection part 13B, having a slightly large gap between reflection part 13B and light receiving/emitting element 16, faces light receiving/emitting element 16. At this time, light receiving/emitting element 16 and the reflection part are slightly spaced apart from each other, and therefore reflected light received by light receiving/emitting element 16 is slightly weak. A voltage (for example, a nearly constant voltage of 1.5 V illustrated in FIG. 5B) in response to this slightly weak reflected light is output as position signal R1 from light receiving/emitting element 16 to controller 25.

Then, controller 25 detects that position signal R1 is not the signal of the predetermined cycle, and determines that movable body 13 is not located at the neutral position. At the same time, a voltage value of position signal R1 falls within a preset threshold value (which is, for example, a reference value of 1.5 V and within a range from 1.25 V to 1.75 V) for right direction determination, and therefore controller 25 detects that operation body 21 and movable body 13 are operated to move in the right direction.

(Moving Operation in Left Direction and Front-rear Direction)

Next, a case where operation body 21 is operated to move in a left direction is described. Note that operation when operation body 21 is operated to move right, and operation when operation body 21 is operated to move left are similar, and a state where operation body 21 is operated to move left is not illustrated.

Movable body 13 once returns to the neutral position, and thereafter further moves the upper surface of case 11 in the left direction. At this time, restraint member 17 moves downward, and controller 25 detects that movable body 13 is not located at the neutral position, similarly to the case of the movement in the right direction described above.

Neutral position detector 40 is electrically conducted, for example, for several seconds to several tens of seconds at a predetermined time interval of one minute to two minutes by controller 25. During the conduction, neutral position detector 40 is operated. When movable body 13 moves from the right direction to the left direction, movable body 13 is instantly at the neutral position. However, in a case where movable body 13 is located at the neutral position for a very short time, controller 25 is set so as not to store a voltage value of neutral position signal N1.

With the movement of movable body 13 in the left direction, reflection part 13B also moves in the left direction. Then, another planar part faces light receiving/emitting element 16, and for example, position signal L1 of 2.5 V is output from light receiving/emitting element 16. Position signal L1 of 2.5 V falls within a preset threshold value (which is, for example, a reference value of 2.5 V and within a range from 2.25 V to 2.75V) for left direction determination, and therefore controller 25 detects that operation body 21 and movable body 13 are operated to move in the left direction.

In a case where operation body 21 is operated to move in a front direction or a rear direction, with the movement of reflection part 13B in the front or rear direction, for example, light receiving/emitting element 16 outputs a voltage signal of 1.0 V in a case of the movement in the front direction, and outputs a voltage signal of 2.0 V in a case of the movement in the rear direction. In a case where the voltage signal is 1.0 V, the voltage signal falls within a preset threshold value (which is, for example, a reference value of 1.0 V and within a range from 0.75 V to 1.25V) for front direction determination, and therefore controller 25 detects that movable body 13 is operated to move in the front direction. In a case where the voltage signal is 2.0 V, the voltage signal falls within a preset threshold value (which is, for example, a reference value of 2.0 V and within a range from 1.75 V to 2.25 V) for rear direction determination, and therefore controller 25 detects that movable body 13 is operated to move in the rear direction.

Thus, when neutral position signal N1 of the predetermined cycle is input, controller 25 determines that movable body 13 is located at the neutral position, and detects and stores the voltage value of neutral position signal N1.

When operation body 21 is operated to move in each direction, a position signal in response to the moving direction is output from light receiving/emitting element 16 to controller 25, with movement of movable body 13. Then, controller 25 detects which direction operation body 21 and movable body 13 move. A cursor, a pointer or the like displayed on the liquid crystal display panel via the electronic circuit of the vehicle is moved in an operated direction, and a desired menu is selected from the plurality of menus.

Furthermore, after moving operation in a direction different from the neutral position is performed, when the hand is separated from operation body 21, restraint member 17 moves upward by elastic return force of spring 18, and comes into elastic contact with the central part from the left or right side of cam part 13C. Consequently, operation body 21 and movable body 13 return to the neutral position.

That is, operation body 21 of the multidirectional input device, mounted on the console box or the like around his/her hand of a driver, is operated to move in the right-left direction, the front-rear direction, or various directions between the right-left direction and the front-rear direction, so that various operation of a device in the vehicle, for example, selection of the plurality of menus displayed on the liquid crystal display panel, can be performed.

[Operation after Voltage Variation of Multidirectional Input Device]

Next, a case where output from light receiving/emitting element 16 of position detector 13 varies depending on ambient temperature change, voltage variation of a power supply, or the like is described.

When operation body 21 and movable body 13 are located at the neutral position, neutral position signal N1 is input to controller 25. Neutral position signal N1 is a signal obtained by superimposition of a voltage detected by light receiving/emitting element 16 with the signal of the predetermined cycle output from light receiving/emitting element 19. When neutral position signal N1 is input to controller 25, controller 25 determines that movable body 13 is located at the neutral position. At the same time, controller 25 stores the voltage value of neutral position signal N1 when movable body 13 is located at the neutral position.

At this time, it is assumed that neutral position signal N1 lowers. For example, neutral position signal N1 is assumed to be varied to 1.5 V. In this case, controller 25 detects that neutral position signal N1 is varied to 1.5 V with respect to reference voltage 3 V of normal neutral position signal N1, and stores a fact that a rate of change to a voltage after variation to a reference voltage is 1/2.

Controller 25 reflects the rate of change of 1/2 detected at the neutral position to the reference value, as a threshold value for voltage signal determination in a case where movable body 13 is located in the right direction. More specifically, the reference value is corrected from 1.5 V to 0.75 V, and the range is corrected to 0.625 V to 0.875 V.

Additionally, controller 25 reflects the rate of change of 1/2 detected at the neutral position to the reference value, as a threshold value for voltage signal determination in a case where movable body 13 is located in the left direction. More specifically, the reference value is corrected from 2.5 V to 1.25 V, and the range is corrected to 1.125 V to 1.375 V.

Furthermore, controller 25 reflects the rate of change of 1/2 detected at the neutral position to the reference value, as a threshold value for voltage signal determination in a case where movable body 13 is located in the front direction. More specifically, the reference value is corrected from 1.0 V to 0.5 V, and the range is corrected to 0.375 V to 0.625 V.

Furthermore, controller 25 reflects the rate of change of 1/2 detected at the neutral position to the reference value, as a threshold value for voltage signal determination in a case where movable body 13 is located in the rear direction. More specifically, the reference value is corrected from 2.0 V to 1.0 V, and the range is corrected to 0.875 V to 1.125 V.

That is, in the multidirectional input device of the exemplary embodiment, in a case where the voltage of the position signal output from light receiving/emitting element 16 varies depending on ambient temperature change, voltage variation of a power supply or the like, when movable body 13 is located at the neutral position, controller 25 can store the voltage value of the position signal in the neutral position state. Additionally, controller 25 detects change from the normal predetermined reference voltage, and corrects the threshold value of each reference value and range used when each operating direction is determined, in response to the change. Accordingly, even when the voltage signal output from light receiving/emitting element 16 varies, it is possible to suppress erroneous detection in determination of the operating direction of movable body 13.

Note that, in the above description, controller 25 corrects a threshold value for determination for determining the operating direction, by use of the rate of change in the voltage of neutral position signal N1 at the neutral position. More specifically, the threshold value for determination is corrected by proportion of the rate of change to the reference value. However, the threshold value may be corrected by a predetermined correction ratio other than proportion of variation in a voltage in response to a property of light receiving/emitting element 16 or a circuit component.

In a state where operation body 21 is not operated, namely, in a state where movable body 13 is in a stationary state of being held at the neutral position, controller 25 conducts a voltage to light receiving/emitting element 19 intermittently once per predetermined time, for example, one minute to two minutes, in order to suppress power consumption. When a voltage is conducted to light receiving/emitting element 19, controller 25 detects the neutral position of movable body 13. At the same time, controller 25 detects the voltage signal output from light receiving/emitting element 16, compares the detected voltage signal with the normal reference voltage, and corrects the threshold value of each moving direction in response to a comparison result.

That is, multidirectional input device 26 of this exemplary embodiment includes case 11, and movable body 13 that is mounted on case 11 so as to be movable in the plurality of directions with the predetermined neutral position as a base point. Furthermore, multidirectional input device 26 includes position detector 30 that outputs a position signal in response to a position of movable body 13, and neutral position detector 40 that outputs a signal when movable body 13 is located at the neutral position. Additionally, multidirectional input device 26 includes controller 25 that detects a moving direction of movable body 13 by a signal output from position detector 30. Controller 25 corrects the threshold value for determination for detecting the moving direction in response to the signal output from position detector 30 and the signal output from neutral position detector 40.

According to this configuration, controller 25 can detect that movable body 13 is located at the neutral position by the signal output from neutral position detector 40 and the signal output from the position detector 30. At the same time, controller 25 can detect the position signal from position detector 30. Additionally, controller 25 can correct the threshold value for determination in order to detect the moving direction, in response to the change in the voltage value of the position signal when movable body 13 is located at the neutral position.

Accordingly, in multidirectional input device 26 of this exemplary embodiment, erroneous detection of the operating direction (moving direction) can be prevented even in a case where the voltage signal output from light receiving/emitting element 16 varies depending on ambient temperature change, voltage variation of a power supply, or the like. Additionally, the multidirectional input device of this exemplary embodiment enables reliable operation.

[Connection of Controller 25 and Multidirectional Input Unit 22]

Herein, connection of controller 25 and multidirectional input unit 22 is described.

Generally, neutral position detector 40 and controller 25 are connected by two input and output lead wires. Additionally, position detector 30 and controller 25 are also connected by two input and output lead wires. That is, a total of four lead wires are needed.

However, in the multidirectional input device of this exemplary embodiment, controller 25 outputs a predetermined periodic signal to neutral position detector 40, and neutral position detector 40 outputs a second signal synchronized with the predetermined periodic signal to position detector 30.

According to this configuration, a configuration by a total of two lead wires 23A, 23B, in which controller 25, and each of neutral position detector 40 and position detector 30 are each connected by one lead wire, is possible. Accordingly, it is possible to reduce a number of signal lines. The multidirectional input device of this exemplary embodiment becomes more inexpensive than a multidirectional input device having four signal lines.

Herein, a modification of the multidirectional input device of this exemplary embodiment is described with reference to FIG. 1B.

Figure 1B:
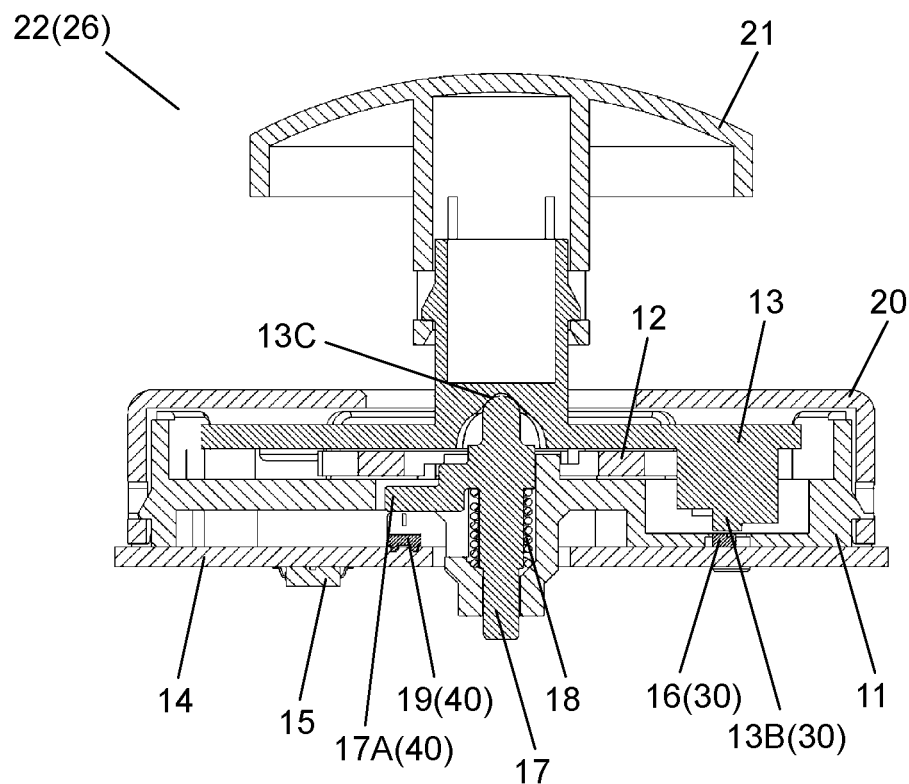
FIG. 1B is a sectional view of a multidirectional input device according a modification of the exemplary embodiment.

FIG. 1B is a sectional view of the modification of the multidirectional input device of this exemplary embodiment. As illustrated in FIG. 1B, also in the multidirectional input device having multidirectional input unit 22 with controller 15 incorporated therein, it is possible to attain inexpensive controller having a reduced number of pins of a microcomputer and the like. A difference between FIG. 1A and FIG. 1B is as follows. In multidirectional input device 26 illustrated in FIG. 1A, controller 25 is externally mounted on multidirectional input unit 22 via lead wires 23A, 23B. On the other hand, in multidirectional input device 26 illustrated in FIG. 1B, controller 15 is incorporated in multidirectional input unit 22. Other components in FIG. 1B are similar to the components in FIG. 1A, and therefore denoted by the same reference numerals, and description thereof is omitted.

Furthermore, a predetermined periodic signal is output from controller 25 to neutral position detector 40, neutral position detector 40 outputs neutral position signal N1 synchronized with the predetermined periodic signal to position detector 30, and the position signal is superimposed with neutral position signal N1 to be output to controller, as an aperiodic voltage signal. According to this configuration, controller 25 can reliably determine that movable body 13 is located at the neutral position, when the signal output from neutral position detector 40 is the predetermined periodic signal.

Note that, when the position signal is, for example, an aperiodic substantially constant voltage signal, the controller can more reliably determine that movable body 13 is not located at the neutral position, but moves in any direction, from the voltage. Accordingly, signal determination is further facilitated, and operating direction can be more reliably detected.

That is, in multidirectional input device 26 of this exemplary embodiment, controller 25 more preferably outputs the predetermined periodic signal to neutral position detector 40, and neutral position detector 40 more preferably outputs the signal synchronized with the predetermined periodic signal to position detector 30.

According to this configuration, controller 25 can more reliably detect whether the movable body is not located at the neutral position.

Note that, in the multidirectional input device of the exemplary embodiment, neutral position detector 40 has light receiving/emitting element 19, and detects the neutral position by output from light receiving/emitting element 19 by vertical movement of arm part 17A accompanied with vertical movement of restraint member 17. However, in place of light receiving/emitting element 19 and arm part 17A, a magnet may be fixed to arm part 17A of restraint member 17, and a magnetism detection element such as a hall element may be disposed so as to face the magnet. Even when the neutral position is detected by output from the magnetism detection element accompanied with vertical movement of the arm part, the present invention can be implemented.

A method for detection in neutral position detector 40 is performed by use of change of light or magnetism, so that contact instability or the like due to a surrounding environment or repeated frequent use is unlikely to be caused compared to a switch by mechanical contact/separation, and detection reliability of the multidirectional input device can be enhanced.

Although reliability of detection by multidirectional input device is somewhat degraded, a push switch or a lever switch may be disposed below the arm part 17A, and neutral position signal N1 may be output by turning on/off of the above switch with vertical movement of arm part 17A accompanied with vertical movement of restraint member 17.

Furthermore, in multidirectional input device 26 illustrated in FIG. 1A, multidirectional input device 26 is configured of multidirectional input unit 22 and controller 25 of an electronic circuit or an electronic device in the vehicle connected to multidirectional input unit 22. Like multidirectional input device 26 illustrated in FIG. 1B, controller 15 is provided in multidirectional input unit 22, and detection of the neutral position and detection of the moving direction of movable body 13 may be performed by multidirectional input device 26.

In multidirectional input device 26 of the exemplary embodiment, arm part 17A extends from restraint member 17. However, arm part 17A does not always have to extend from restraint member 17. Arm part 17A may be integrally formed with restraint member 17, and may not extend from restraint member 17.

In multidirectional input device 26 of the exemplary embodiment, light receiving/emitting element 19 including the light emitting part and the light receiving part disposed so as to face each other is used in neutral position detector 40. However, like light receiving/emitting element 16, a light receiving/emitting element including a light emitting part and a light receiving part disposed adjacent to each other may be used. In a case where the light receiving/emitting element including the light emitting part and the light receiving part disposed adjacent to each other is used, arm part 17A functions as a reflection part.

INDUSTRIAL APPLICABILITY

The multidirectional input device according to the present disclosure can implement reliable various operations with a simple configuration. The multidirectional input device is mainly useful for operation of various electronic devices of a motor vehicle.

REFERENCE MARKS IN THE DRAWINGS 11 case
11A, 13A wall part
11B guide part
12 slider
12A, 12B groove
13 movable body
13B reflection part
13C cam part
14 wiring board
15 controller
16 light receiving/emitting element
17 restraint member
17A arm part
18 spring
19 light receiving/emitting element
20 cover
21 operation body
22 multidirectional input unit
23A, 23B lead wire
24 control unit
25 controller
26 multidirectional input device
30 position detector
40 neutral position detector

The invention claimed is:

1. A multidirectional input device comprising:
   a case;
   a movable body that is mounted on the case so as to be movable in a plurality of directions with a predetermined neutral position as a base point;
   a first position detector that outputs a first signal in response to a position of the movable body;
   a second position detector that outputs a second signal when the movable body is located at the neutral position; and
   a controller that detects a moving direction of the movable body by the first signal, wherein
   the controller corrects a threshold value for determination for detecting the moving direction in response to the first signal and the second signal; and
   a third signal obtained by superimposition of the first signal output from the first position detector with the second signal output from the second position detector is input to the controller.

2. The multidirectional input device according to claim 1, wherein
   the controller outputs a predetermined periodic signal to the second position detector, and the second position detector outputs the second signal synchronized with the predetermined periodic signal to the first position detector.

* * * * *